(12) United States Patent
Yoo et al.

(10) Patent No.: US 6,271,125 B1
(45) Date of Patent: Aug. 7, 2001

(54) METHOD TO REDUCE CONTACT HOLE ASPECT RATIO FOR EMBEDDED DRAM ARRAYS AND LOGIC DEVICES, VIA THE USE OF A TUNGSTEN BIT LINE STRUCTURE

(75) Inventors: Chue-san Yoo; Chen-Jong Wang; Wen-Chuan Chiang, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/713,799

(22) Filed: Nov. 16, 2000

Related U.S. Application Data

(62) Division of application No. 09/252,470, filed on Feb. 18, 1999, now Pat. No. 6,177,340.

(51) Int. Cl.[7] ................................. H01L 21/4763
(52) U.S. Cl. ............................. 438/637; 436/675
(58) Field of Search .................... 438/253, 255, 438/256, 301, 303, 626, 633, 396, 398, 592, 621, 637, 638, 639, 640, 649, 675

(56) References Cited

U.S. PATENT DOCUMENTS

| | | | |
|---|---|---|---|
| 5,600,598 | 2/1997 | Skjaveland et al. | 365/189.11 |
| 5,691,223 | 11/1997 | Pittikoun et al. | 437/52 |
| 6,008,085 | * 12/1999 | Sung et al. | 438/253 |

* cited by examiner

Primary Examiner—David Nelms
Assistant Examiner—David Nhu
(74) Attorney, Agent, or Firm—George O. Saile; Stephen B. Ackerman

(57) ABSTRACT

A method for reducing the high aspect ratios, encountered when forming, and filling, narrow diameter contact holes, in thick insulator layers, has been developed, featuring a two step contact hole opening and filling procedure. First, lower narrow diameter contact holes are opened in lower levels of insulator layers, then filled with tungsten. After deposition of upper levels of insulator layers, upper narrow diameter contact holes are formed, exposing the tungsten filled, lower diameter contact holes. A second tungsten layer fills the upper, narrow diameter contact hole, resulting in a final narrow diameter contact hole, in thick insulator layers, formed with reduced aspect ratios, via use of the two contact hole openings, and the two tungsten fill procedures. In addition these procedures allow a damascene, tungsten bit line structure, to be formed in a dual shaped opening, in lower insulator layers.

11 Claims, 17 Drawing Sheets

METHOD TO REDUCE CONTACT HOLE ASPECT RATIO FOR EMBEDDED DRAM ARRAYS AND LOGIC DEVICES, VIA THE USE OF A TUNGSTEN BIT LINE STRUCTURE

This application is Div. of Ser. No. 09/252,470 filed Feb. 18, 1999 now U.S. Pat. No. 6,177,340.

BACKGROUND OF THE INVENTION (1) Field of the Invention

This invention relates to fabrication methods used for semiconductor devices, and more specifically a process used to integrate logic and memory devices on a single semiconductor chip.

(2) Description of Prior Art

Advanced semiconductor chips, now being manufactured in industry, are composed of logic or memory devices. Logic devices are used to process information or data, while memory devices are used for data storage. These two types of devices can be found in almost all computers, however they are usually found on specific chips, reserved for either logic or memory applications. In systems in which logic and memory devices are packaged separately, data signals between the two may have to pass through several levels of packaging, which can result in undesirable propagation delays. In addition the manufacturing costs for fabricating wafers producing only logic chips, and wafers with only memory chips, are greater than if both logic and memory applications can be incorporated on the same chip. Therefore for performance and cost reasons the semiconductor industry has been motivated to produce a semiconductor chip with both the desired logic and memory requirements.

One difficulty encountered when attempting to integrate logic cells, with memory cells that are comprised of embedded dynamic random access memory, (DRAM), devices, is the ability to open contact holes, to regions of a semiconductor substrate, in thick insulator layers. The DRAM devices, comprised of bit line structures, as well as stacked capacitor structures, both located overlaying the semiconductor substrate, require thick insulator layers, to successfully isolate these components from adjacent conductive features. In addition with the use of sub—0.25 uM groundrules, the contact holes in the thick insulator layers can be designed to dimensions as narrow as 0.3 uM, in diameter, resulting in contact hole aspect ratios of about 7 to 1. This high contact hole aspect ratio is not only difficult to create, via anisotropic reactive ion etching procedures, but also difficult to fill, using conventional chemical vapor deposition, or plasma deposition procedures.

This invention will describe a process for integrating logic devices, and an embedded DRAM array, in which the aspect ratio for a contact hole, is reduced to about one half of the aspect ratio for a contact hole, used in conventional logic—DRAM integrations. This is accomplished using a two stage, contact hole opening, with the first stage forming a C1, first contact hole, in only the lower insulator layers, followed by a tungsten fill, which allows contact to underlying features in the logic and DRAM memory regions to be achieved. The second stage of this procedure features the creation of a C2, second contact hole, in upper insulator layers, directly overlying a tungsten filled, C1 contact holes After filling of the C2 contact holes with tungsten, a tungsten filled, narrow diameter, deep contact hole is established, achieved via a two stage procedure, which each procedure resulting in a contact hole with reduced aspect ratios. The first stage of this procedure, used to create tungsten filled, CI contact holes, also creates a dual shaped opening, allowing a damascene, tungsten bit line structure, to be realized, thus reducing bit line resistance, when compared to counterparts fabricated from metal silicide layers. Related prior art, such as Pittikoun et al, in U.S. Pat. No. 5,691,223, describe a process for forming a capacitor over a bit line structure, for DRAM applications, however tungsten silicide is used in place of tungsten, and more importantly a two stage contact hole opening, and fill, used in this invention to reduce the aspect ratio of the contact hole, is not described in this prior art.

SUMMARY OF THE INVENTION

It is an object of this invention to provide a process for fabricating logic devices and an embedded DRAM array on the same silicon chip, or integrated circuit.

It is another object of this invention to reduce the aspect ratio of narrow diameter contact holes, created in thick insulator layers, via use of a two stage contact hole formation procedure, comprised of a narrow diameter, tungsten filled, lower contact hole, and of a overlying, narrow diameter, tungsten filled, upper contact hole.

It is yet another object to create a damascene type, tungsten bit line structure, in a dual shaped contact hole, for the DRAM array cell.

In accordance with the present invention a fabrication process is described for integrating DRAM and logic devices on the same silicon chip, featuring a two stage contact hole opening procedure, to reduce the aspect ratio for narrow diameter contact holes, in thick insulator layers. A first region of a semiconductor substrate is used for the logic devices, while a second region of the semiconductor substrate is used for the embedded DRAM array. An N well region, used for subsequent P channel, (PFET) devices, and a P well region, used for subsequent N channel, (NFET) devices, are formed in the first region of the semiconductor substrate. Insulator filled, shallow trenches are next formed in the logic, as well as the embedded array region, for purposes of isolation. A first gate insulator layer is formed in the logic region, followed by the creation of polysilicon gate structures. After formation of N type, and P type, lightly doped source/drain regions, silicon nitride spacers on the sides of the polysilicon gate structures, and N type, and P type, heavily doped source/drain regions, in the logic region, a titanium silicide layer is formed on the top surface of all polysilicon gate structures, on the top surface of the N type, heavily doped source/drain region, of the NFET devices, and on the top surface of the P type, heavily doped source/drain region, of the PFET devices. After formation of a second gate insulator layer, in the DRAM region, silicon nitride capped, polycide, (metal silicide—polysilicon), gate structures are formed, followed by the formation of N type, lightly doped source/drain regions, in regions of the semiconductor substrate, not covered by the silicon nitride capped, polycide gate structure, and followed by the formation of silicon nitride spacers, on the sides of the silicon nitride capped, polycide gate structures.

Two self-aligned contact, (SAC), openings are formed in a first insulator layer, exposing two source/drain regions, located between silicon nitride capped, polycide gate structures, in the DRAM region of the semiconductor substrate. Polysilicon plugs are then formed in the SAC openings, each contacting a source/drain region. After deposition of a second insulator layer, a wide opening is formed in a top portion of the second insulator layer. A first narrow diameter, lower contact hole opening is formed in the second and first insulator layers, exposing the top surface of a titanium silicide layer, on a P type source/drain region, in the logic region. A second narrow diameter, lower contact hole opening is created in the second insulator layer, in a portion of the first insulator layer, and in a silicon nitride layer, exposing the metal silicide layer, of a silicon nitride capped, polycide gate structure, in the DRAM region. A third narrow diameter, lower contact hole opening is created in the lower portion the second insulator layer, located within the wide opening, previously created in the top portion of the second insulator layer, creating a dual shaped opening, comprised of an upper, wide diameter, opening, and of a lower, narrow diameter opening, exposing the top surface of a first polysilicon plug. A fourth narrow diameter, lower contact hole opening is created in the second insulator layer, exposing the top surface of a second polysilicon plug. All the lower contact openings are filled with tungsten, with a tungsten bit line structure, created in the dual shaped opening, and contacting the first polysilicon plug.

A narrow diameter opening is created in a third insulator layer, directly overlying, and exposing the tungsten filled, fourth narrow diameter opening. A crown shaped, polysilicon storage node shape is next formed, completely filling the narrow diameter opening in the third insulator layer, and overlying a portion of the top surface of the third insulator layer. A layer of hemispherical grain silicon, is formed on the inside surfaces of the crown shaped, polysilicon storage node shape, creating the storage node for the DRAM capacitor. A capacitor dielectric layer, and a polysilicon cell plate structure, complete the fabrication of the DRAM capacitor structure. A fourth insulator layer is deposited, followed by the opening of narrow diameter, upper contact holes. A first narrow diameter, upper contact hole opening, is formed in the fourth insulator layer, and in the third insulator layer, directly overlying the tungsten filled, first narrow diameter, lower contact hole opening. A second narrow diameter, upper contact hole opening, is formed in the fourth insulator layer, and in the third insulator layer, directly overlying the tungsten filled, second narrow diameter, lower contact hole opening. A third narrow diameter, upper contact hole opening, is created in the fourth insulator layer, and in the third insulator layer, exposing the top surface of the tungsten bit line structure. A fourth narrow diameter, upper contact hole opening, is created in the fourth insulator layer, exposing a portion of the polysilicon cell plate, of the DRAM capacitor structure. All narrow diameter, upper contact hole openings, are filled with tungsten.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
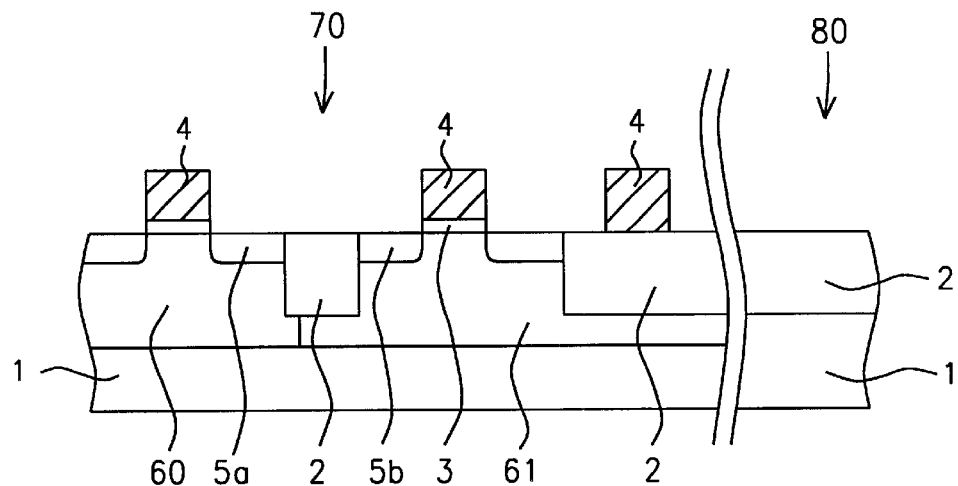
FIGS. 1–20, which schematically, in cross-sectional style, illustrates the stages of fabrication used to construct a a logic region, and an embedded DRAM array region, in a semiconductor substrate, featuring tungsten filled, narrow diameter contact holes, formed using a two stage, contact hole procedure.

The fabrication process used to form logic devices, and embedded DRAM arrays, on a single semiconductor chip, featuring the use of a two stage, contact hole opening procedure, used to reduce the aspect ratio of narrow diameter contact holes, in thick insulator layers, will now be covered in detail. FIG. 1, indicates region 70, to be used as the region in which logic devices will be created, and region 80, where the embedded DRAM array will be fabricated. The gate insulator layers, gate structures, and source/drain regions, for region 70, and region 80, will be described using independent sequences, however many of the processes and sequences, used to create the layers and structures for both regions, can be shared. However for this part of the invention the logic and the array components will be formed individually, using blockout procedures to protect the regions not being addressed.

Figure 2:
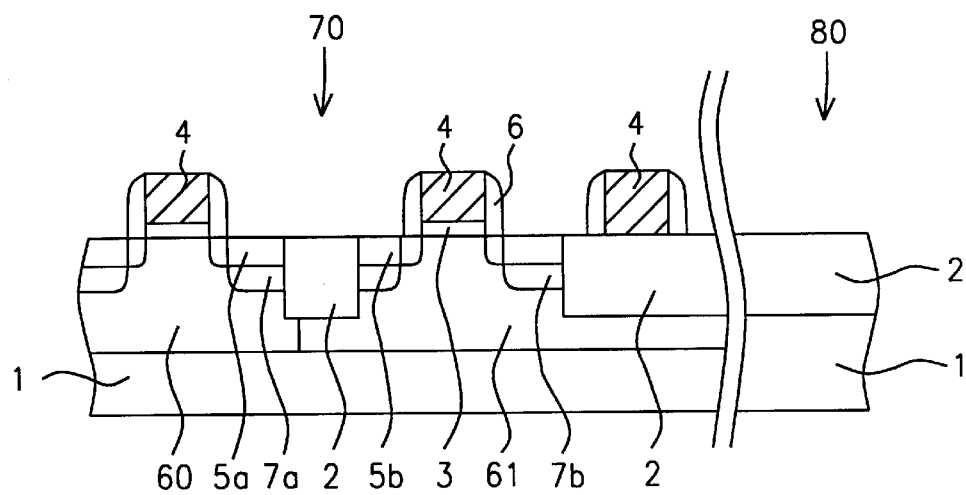
Figure 3:
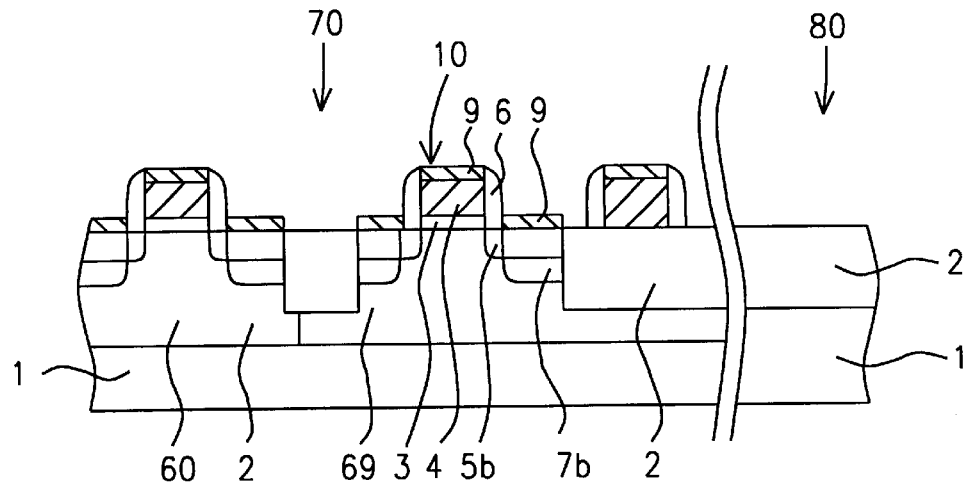

FIGS. 1–3, describe the formation of the transfer gate transistors, used in logic region 70. A P type, single crystalline silicon substrate 1, having a <100> crystallographic orientation is used. A P well region 60, to be used for a subsequent NFET devices, and an N well region 61, to be used for subsequent PFET devices, are formed in logic region 70, via conventional masking, photoresist block out shapes, and ion implantation procedures. Shallow trench isolation, (STI), regions 2, are formed by: creating a shallow trench in semiconductor substrate 1, via conventional photolithographic and anisotropic reactive ion etching, (RIE), procedures; deposition of a silicon oxide layer, completely filling the shallow trench; and removal of the silicon oxide layer from the top surface of semiconductor substrate 1, via chemical mechanical polishing, (CMP), or via RIE procedures. A first gate insulator layer 3, comprised of silicon dioxide, is thermally grown in an oxygen—steam ambient, at a temperature between about 800 to 1000° C., to a thickness between about 40 to 60 Angstroms, and shown schematically in FIG. 1. A polysilicon layer 4, is next deposited, via low pressure chemical vapor deposition, (LPCVD), procedures, to a thickness between about 1000 to 3000 Angstroms. Polysilicon layer 4, can be doped in situ, during deposition via the addition of arsine, or phosphine, to a silane ambient, or polysilicon layer 4, can be deposited intrinsically and doped via an ion implantation procedure, using arsenic or phosphorous ions. Conventional photolithographic, and anisotropic RIE procedures, using $Cl_2$ as an etchant, are used to form the polysilicon gate structures, comprised of polysilicon layer 4. After removal of the photoresist shape, used to define the polysilicon gate structure, via plasma oxygen ashing procedures and careful wet cleans, another photoresist shape is used as a first block out mask, allowing N type, lightly doped source/drain regions 5a, to be formed in the NFET region of logic region 70, via an ion implantation of arsenic or phosphorous, at an energy between about 20 to 50 KeV, and at a dose between about 1E12 to 1E13 atoms/$cm^2$. After removal of the first blockout mask, via plasma oxygen ashing and careful wet cleans, another photoresist shape, used as a second block out mask, is used to allow P type, lightly doped source/drain regions 5b, to be formed only in an area of logic region 70, used for PFET devices. The P type, lightly doped source/drain regions 5b, schematically shown in FIG. 1, are formed via ion implantation of boron ions, at an energy between about 20 to 50 KeV, at a dose between about 1E12 to 1E14 atoms/$cm^2$. The second block out mask is again removed via plasma oxygen ashing and careful wet cleans. The wet clean procedures, containing dilute solutions of HF, remove the regions of gate insulator 3, not covered by the polysilicon gate structures. The space between the lightly doped source/drain regions, located under the polysilicon gate structures, is about 0.25 uM, subsequently resulting in a narrow channel length, and enhanced performance, for the logic devices.

A silicon nitride layer is next deposited, using LPCVD or plasma enhanced chemical vapor deposition, (PECVD), procedures, at a thickness between about 800 to 2000 Angstroms. An anisotropic RIE procedure, using $SF_6$ as an etchant, is then performed, creating silicon nitride spacers 6, located on the sides of the polysilicon gate structures. Heavily doped, N type source/drain regions 7a, and heavily doped, P type source/drain regions 7b, shown schematically in FIG. 2, are next formed, using the same photoresist block out procedures and sequence, previously used for the lightly doped, N type, and the lightly doped, P type, source/drain regions. Heavily doped, N type source drain region 7a, is formed via ion implantation of arsenic or phosphorous, at an energy between about 20 to 60 KeV, at a dose between about 1E15 to 1E16 atoms/cm, while heavily doped, P type source/drain region 7b, is formed via ion implantation of boron ions, at an energy between about 20 to 60 KeV, at a dose between about 1E15 to 1E16 atoms/cm$^2$. The photoresist block out shapes are removed via plasma oxygen ashing and careful wet clean procedures.

A layer of titanium is next deposited using R.F. sputtering procedures, to a thickness between about 200 to 400 Angstroms. A first anneal procedure, using either conventional furnace, or rapid thermal anneal, (RTA), procedures, at a temperature between about 600 to 800° C., is used to form a self-aligned, titanium silicide layer 9, in regions in which the titanium layer overlaid silicon or polysilicon surfaces, with the titanium layer remaining unreacted in regions overlying silicon oxide, or silicon nitride surfaces. The regions of unreacted titanium layer, are removed using a $H_2O_2$—$NH_4OH_4$ solution, resulting in self-aligned titanium silicide layer 9, on heavily doped source/drain regions, and resulting in more conductive word line structures 10, comprised of titanium silicide layer 9, on the polysilicon gate structures. This is schematically shown in FIG. 3. A second anneal, again performed either in a convectional, or an RTA furnace, at a temperature between about 800 to 900° C., is used to further reduce the resistance of titanium silicide layer 9.

Figure 4:
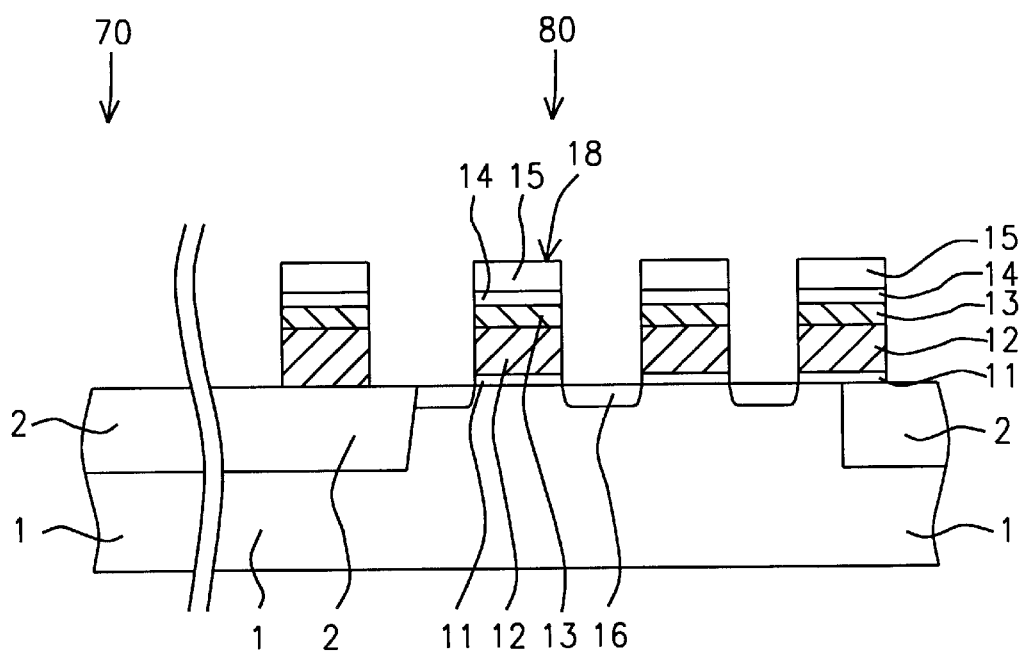
Figure 5:
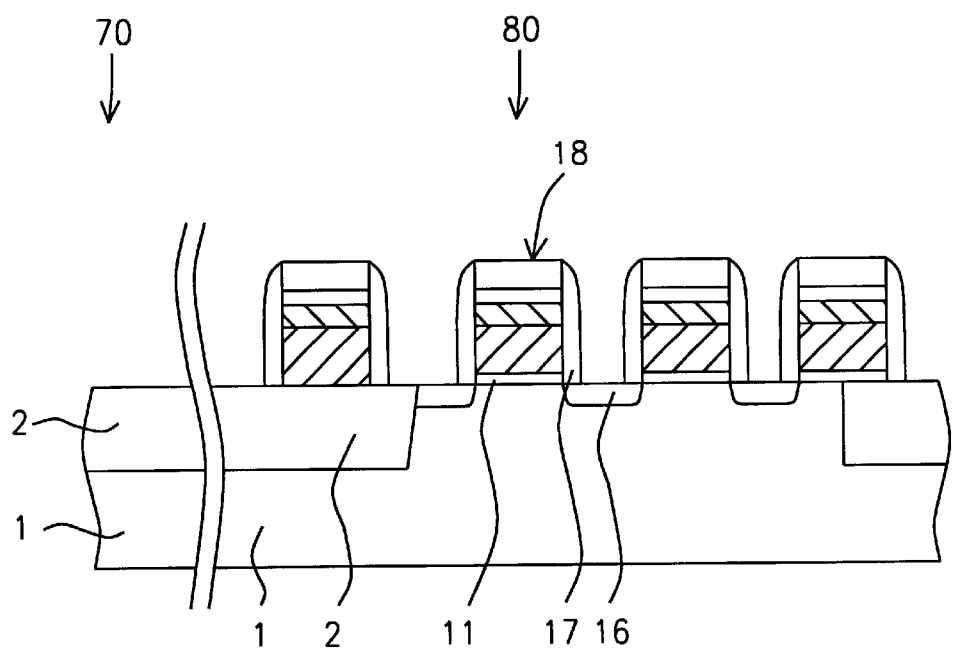

FIGS. 4–5, now describe the formation of the transfer gate transistors, used in DRAM array region 80. As mentioned previously, the formation of the logic and the array transfer gate transistors, if desired, can be accomplished using shared process steps, instead of forming them individually. A second gate insulator layer 11, comprised of a silicon dioxide layer, is thermally grown in a oxygen—steam ambient, at a temperature between about 800 to 1000° C., to a thickness between about 70 to 80 Angstroms. A polysilicon layer 12, is deposited via LPCVD procedures, to a thickness between about 1500 to 2500 Angstroms. Polysilicon layer 12, is either doped in situ, during deposition, via the addition of arsine, or phosphine, to a silane ambient, or polysilicon layer 12, is deposited intrinsically, and doped via ion implantation of arsenic or phosphorous. A tungsten silicide layer 13, is next deposited, via LPCVD procedures, to a thickness between about 750 to 1250 Angstroms, using silane and tungsten hexafluoride as reactants. This is followed by the deposition of a silicon oxide layer 14, via PECVD or LPCVD procedures, at a thickness between about 200 to 500 Angstroms, followed by the deposition of a silicon nitride layer 15, again using LPCVD or PECVD procedure, at a thickness between about 1500 to 2500 Angstroms. Conventional photolithographic, and anisotropic RIE procedures, using $SF_6$ as an etchant for silicon nitride layer 15, using $CHF_3$ as an etchant for silicon oxide layer 14, and using $Cl_2$ as an etchant for tungsten silicide layer 13, and polysilicon layer 12, are used to create silicon nitride capped, polycide, (tungsten silicide—polysilicon), gate structures 18, schematically shown in FIG. 4. After removal of the photoresist shape, used as an etch mask in the definition of silicon nitride capped, polycide gate structures 18, via plasma oxygen ashing and careful wet cleans, lightly doped, N type source/drain regions 16, are formed via ion implantation of arsenic or phosphorous ions, at am energy between about 20 to 60 KeV, at a dose between about 1E13 to 1E14 atoms/cm$^2$. The space between lightly doped, N type source drain regions 16, or the channel length of the DRAM array, transfer gate transistors, is about 0.25 uM. Regions of gate insulator layer 11, not covered by silicon nitride capped, polycide gate structures 18, were removed during the plasma oxygen ashing and wet clean procedures. A silicon nitride layer is next deposited via PECVD or LPCVD procedures, to a thickness between about 800 to 1500 Angstroms, followed by an anisotropic RIE procedure, using $SF_6$ as an etchant, creating silicon nitride spacers 17, on the sides of silicon nitride capped, polycide gate structures 18. This is schematically shown in FIG. 5.

Figure 6:
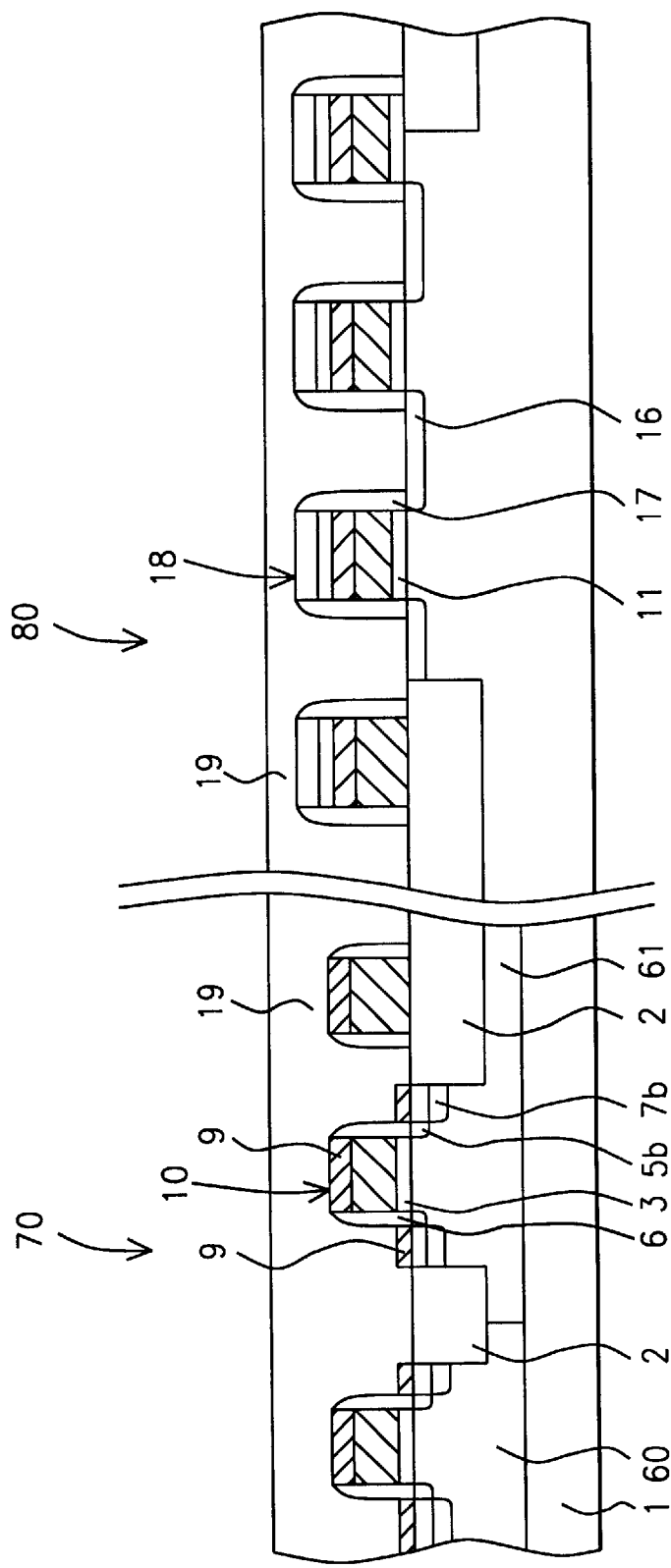
Figure 7:
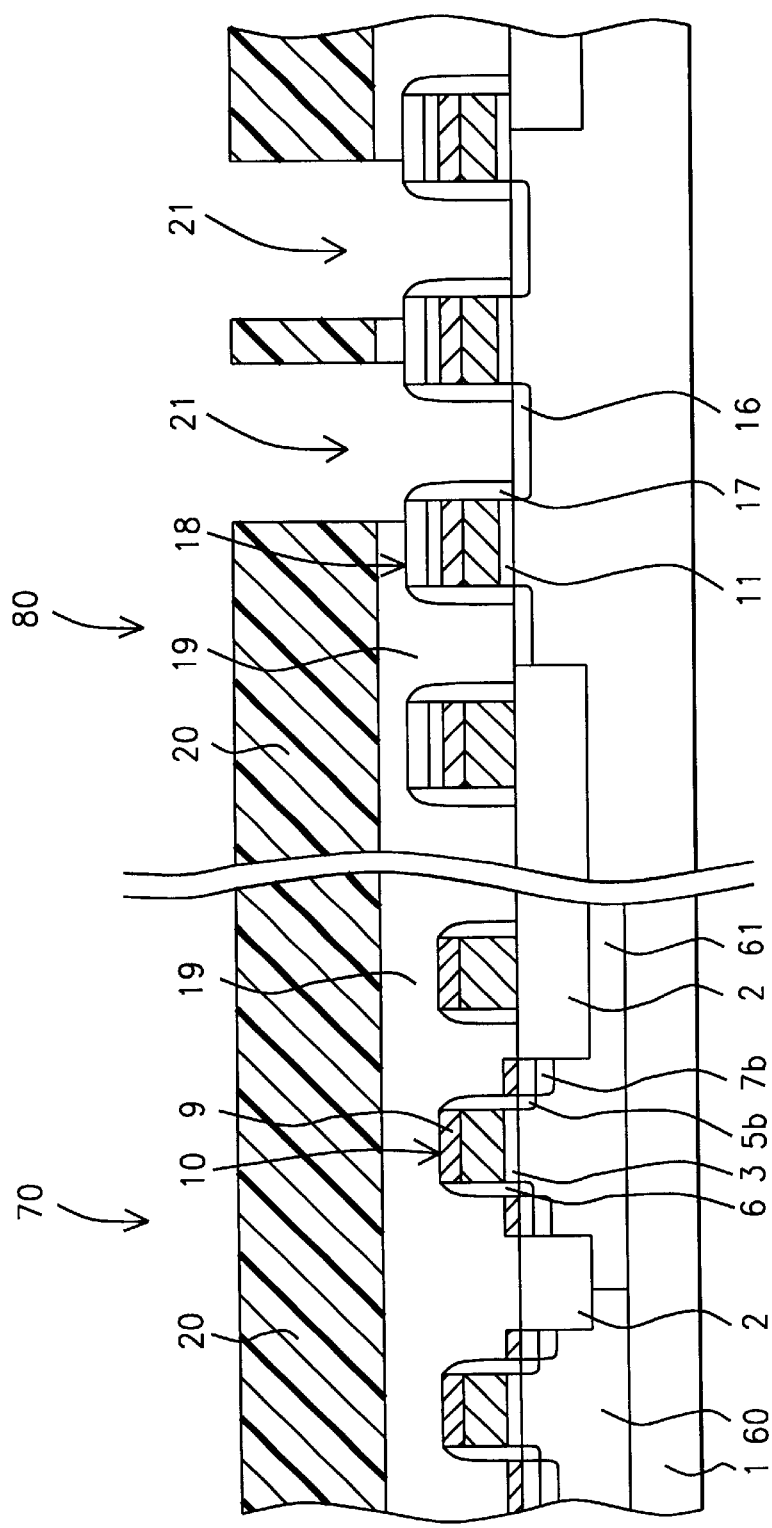
Figure 8:
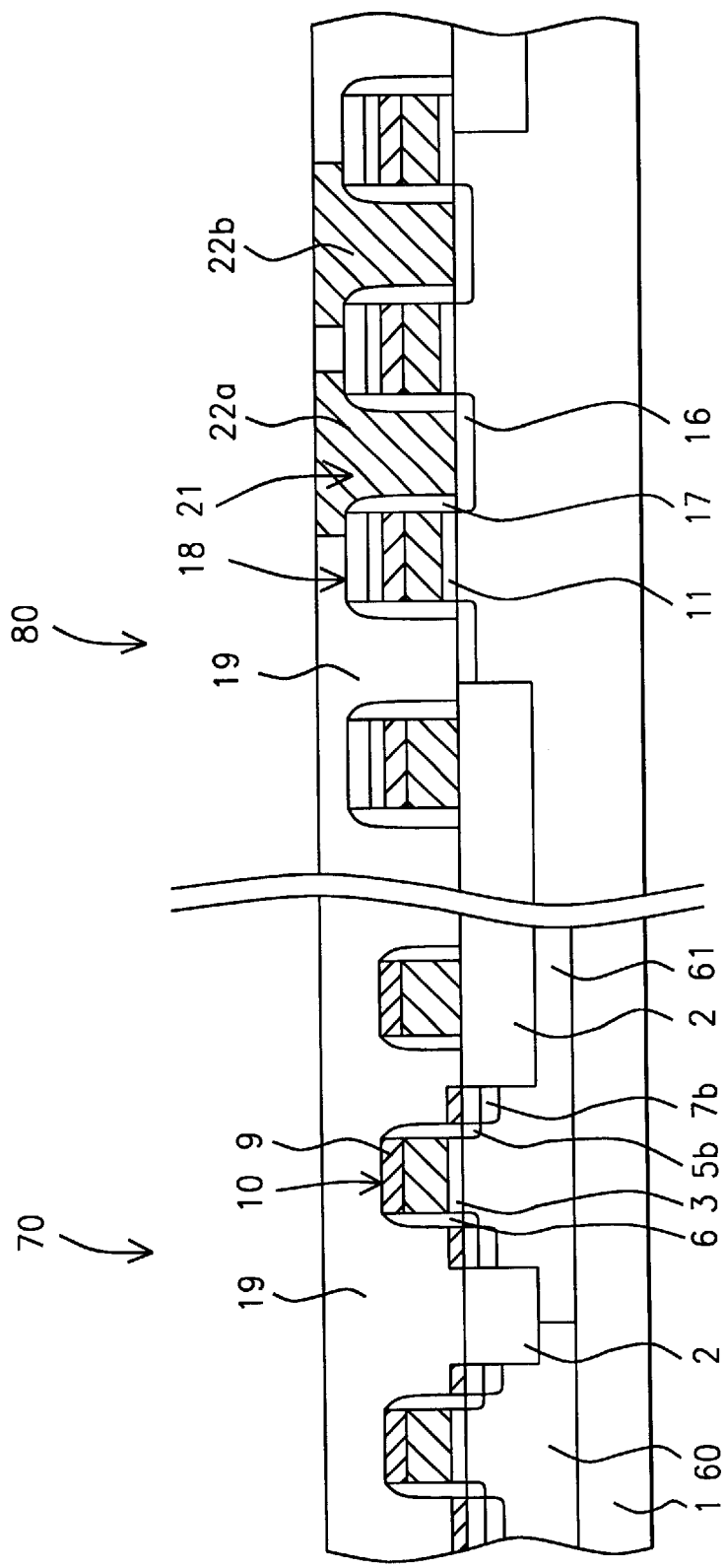

An insulator layer 19, comprised of silicon oxide, is obtained using LPCVD or PECVD procedures, at a thickness between about 7000 to 10000 Angstroms. Insulator layer 19, can also be a boro-phosphosilicate, (BPSG), layer, obtained via LPCVD or PECVD procedures. A planarization procedure, using a CMP, is used to create a smooth top surface topography for insulator layer 19. This is shown schematically in FIG. 6. Photoresist shape 20, is next formed, followed by an anisotropic RIE procedure, using $CHF_3$ as an etchant for insulator layer 19, creating self-aligned contact, (SAC), openings 21, in DRAM array region 80, exposing lightly doped, N type source/drain regions 17. SAC openings 21, are larger in width than the space between silicon nitride capped, polycide gate structures 18, therefore SAC openings 21, also expose a top portion of the silicon nitride capped, polycide gate structures 18. This is schematically shown in FIG. 7. After removal of photoresist shape 20, via plasma oxygen ashing and careful wet cleans, a polysilicon layer is deposited, using LPCVD procedures, at a thickness between about 3000 to 5000 Angstroms. The polysilicon layer is either doped in situ during deposition, via the addition of arsine, or phosphine, to a silane ambient, or the polysilicon layer is deposited intrinsically and doped via ion implantation procedures, using arsenic or phosphorous ions. Regions of polysilicon, residing on the top surface of insulator layer 19, are removed using either a CMP procedure, or a selective, RIE procedure, using $Cl_2$ as an etchant, creating polysilicon plug 22a, and polysilicon plug 22b, located in SAC openings 21. This is shown schematically in FIG. 8.

Figure 9:
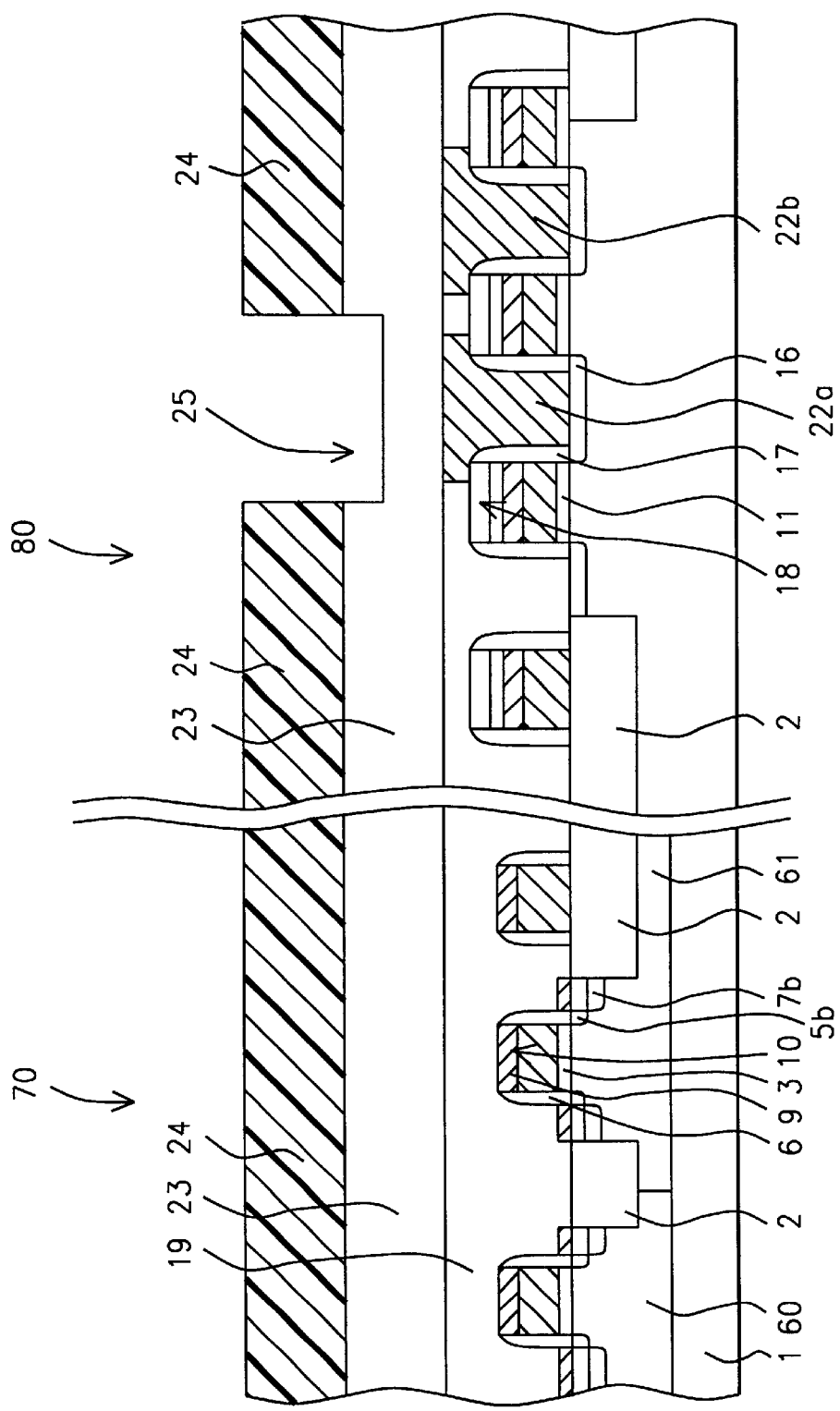
Figure 10:
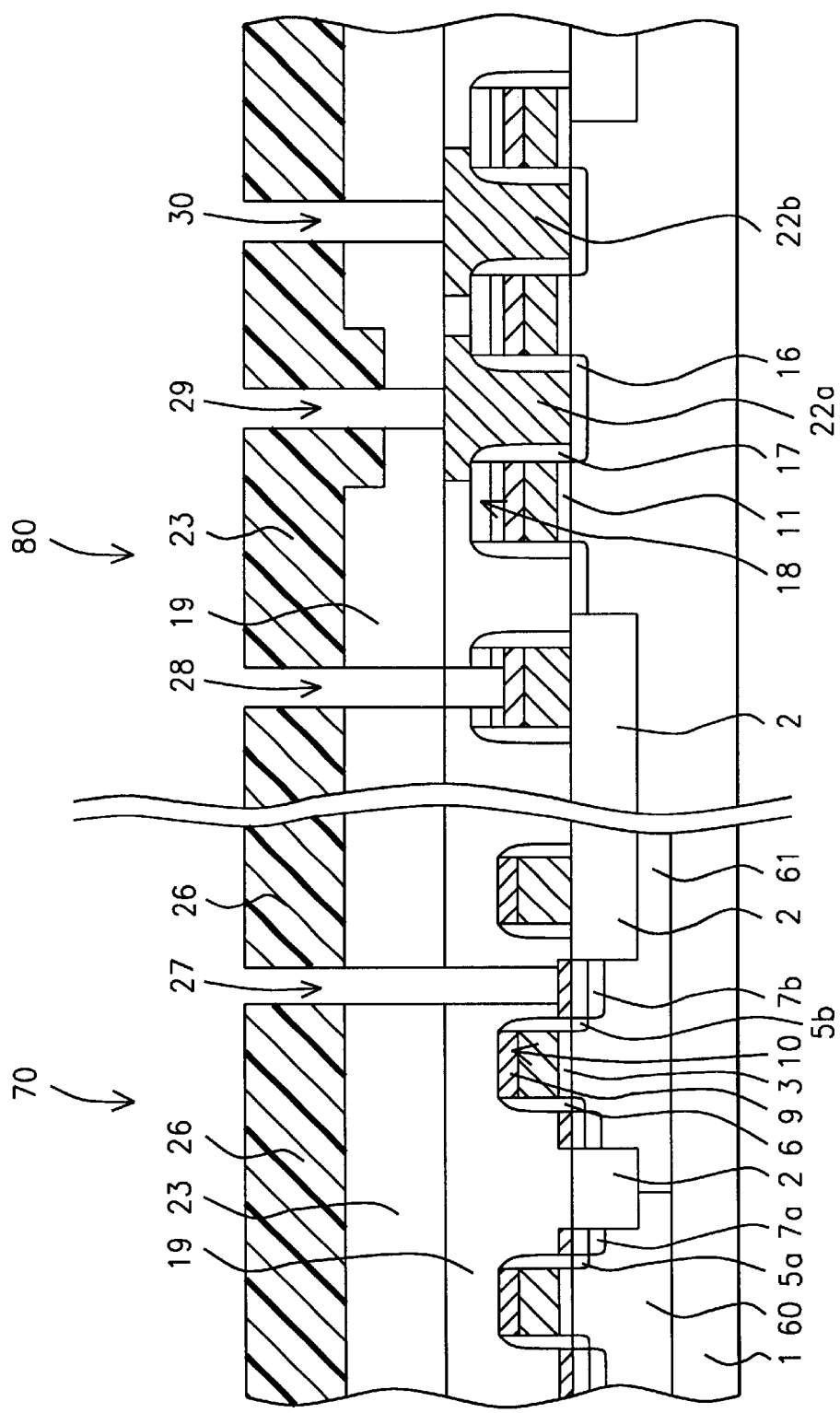

Insulator layer 23, comprised of silicon oxide, or BPSG, is deposited using PECVD or LPCVD procedures, to a thickness between about 3000 to 5000 Angstroms. Photoresist shape 24, is formed and used as an etch mask to create wide opening 25, in the top portion of insulator layer 23. Wide opening 25, schematically shown in FIG. 9, is formed via an anisotropic RIE procedure, using $CHF_3$ as an etchant, to a depth in insulator layer 23, between about 1500 to 2500 Angstroms, and with a width, or a diameter between about 0.30 to 0.40 uM. After removal of photoresist shape 24, via plasma oxygen ashing and careful wet cleans, photoresist shape 26, is formed, allowing narrow diameter, lower contact hole openings 27, 28, 29, and 30, in underlying insulator layers to be created, via anisotropic RIB procedures, using $CHF_3$ as an etchant. Lower contact hole opening 27, with a diameter between about 0.25 to 0.35, is formed in insulator layer 23, and in insulator 19, exposing source/drain region 7b, in logic region 70. Lower contact hole opening 28, with a diameter between about 0.25 to 0.35 uM, is formed in insulator layer 23, in a top portion of insulator layer 19, and in the silicon nitride and silicon oxide layer, on silicon nitride capped, polycide gate structure 18, exposing the tungsten silicide layer, of the silicon nitride capped, polycide gate structure. Lower contact hole opening 30, with a diameter between about 0.25 to 0.35 uM, is formed in insulator layer 23, exposing a portion of the top surface of polysilicon plug 22b. Lower contact hole opening 29, with a diameter between about 0.25 to 0.35 uM, is formed in the bottom portion of insulator layer 23, exposing a portion of the top surface of polysilicon plug 22a. A dual shaped opening, comprised of the wide opening 25, in the top portion of insulator layer 23, and the narrower diameter, lower contact hole opening 29, in the bottom portion of insulator layer 23, is shown schematically in FIG. 10.

Figure 11:
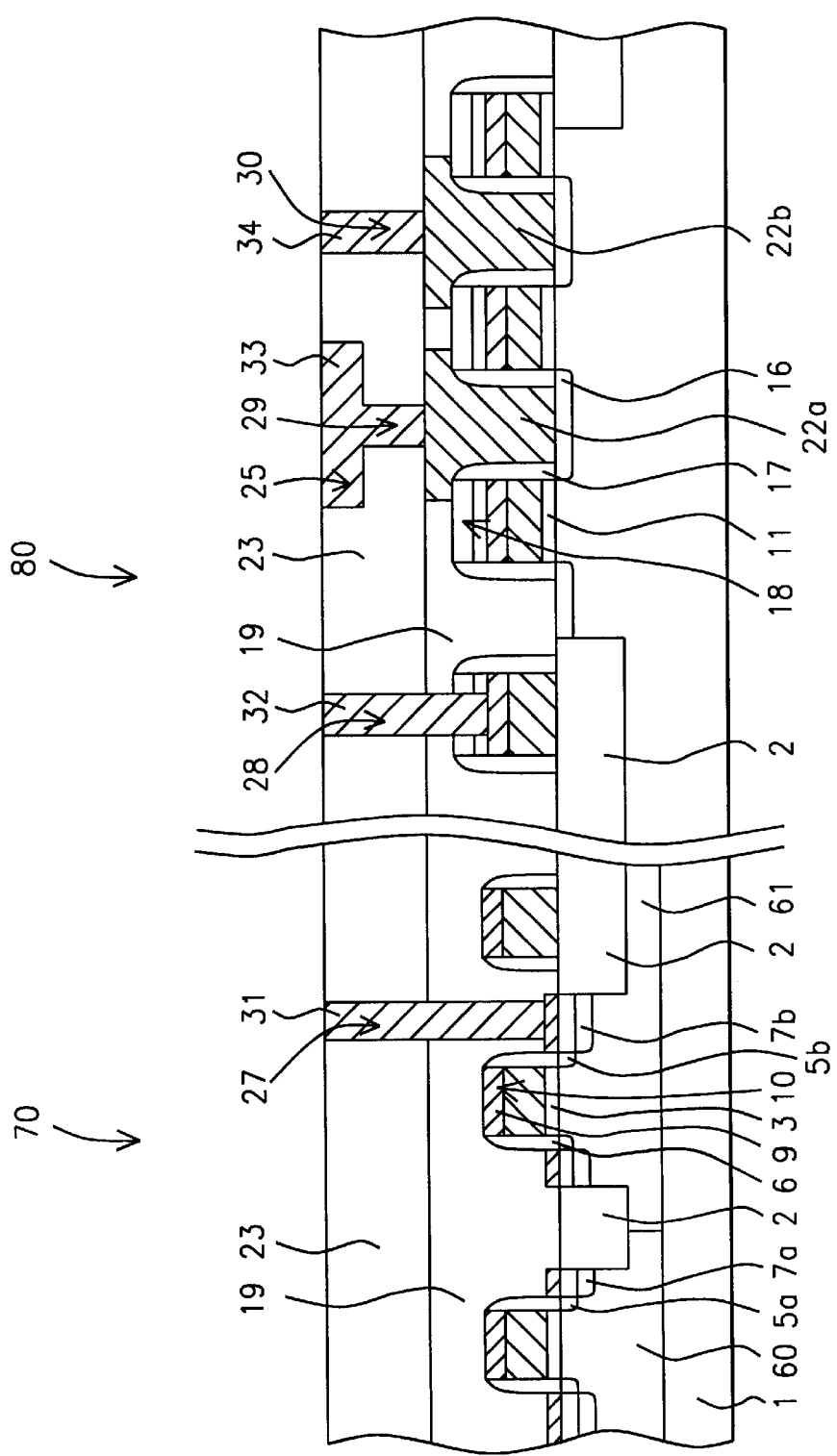

After removal of photoresist shape 26, via plasma oxygen ashing and careful wet cleans, a deposition of an adhesive layer of titanium, at a thickness between about 100 to 500 Angstroms, a barrier layer of titanium nitride, at a thickness between about 100 to 1000 Angstroms, and a conductive layer of tungsten, at a thickness between about 3000 to 6000 Angstroms, is performed via LPCVD or R.F sputtering procedures, completely filling wide opening 25, and lower contact hole openings 27, 28, 29, and 30. Removal of unwanted layers, from the top surface of insulator layer 23, is accomplished using a CMP procedure, or an anisotropic RIE procedure using $Cl_2$ as an etchant, resulting in the creation of: lower tungsten plug 31, in lower contact hole opening 27, contacting source/drain region 7b, in logic region 70; lower tungsten plug 32, in lower contact hole opening 28, contacting silicon nitride capped, polycide gate structure 18, in DRAM array region 80; lower tungsten plug 34, in lower contact hole opening 30, contacting polysilicon plug 22b, in DRAM array region 80, and the dual shaped, tungsten structure 33, in wide opening 25, and in lower contact hole opening 29, contacting polysilicon plug 22b, with dual shaped, tungsten structure 33, used as a bit line structure, in DRAM array region 80. The result of these procedures is schematically shown in FIG. 11.

Figure 12:
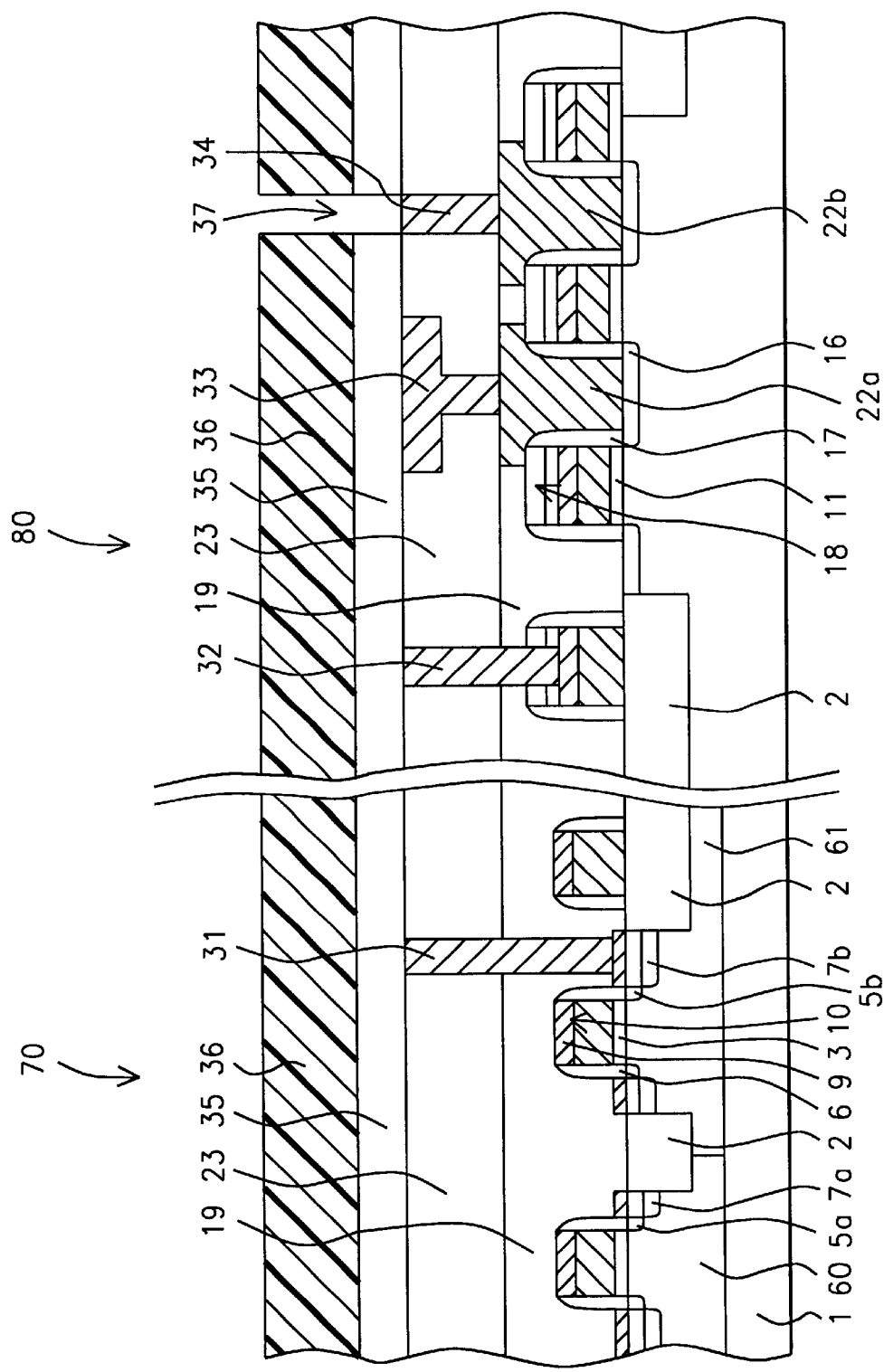
Figure 13:
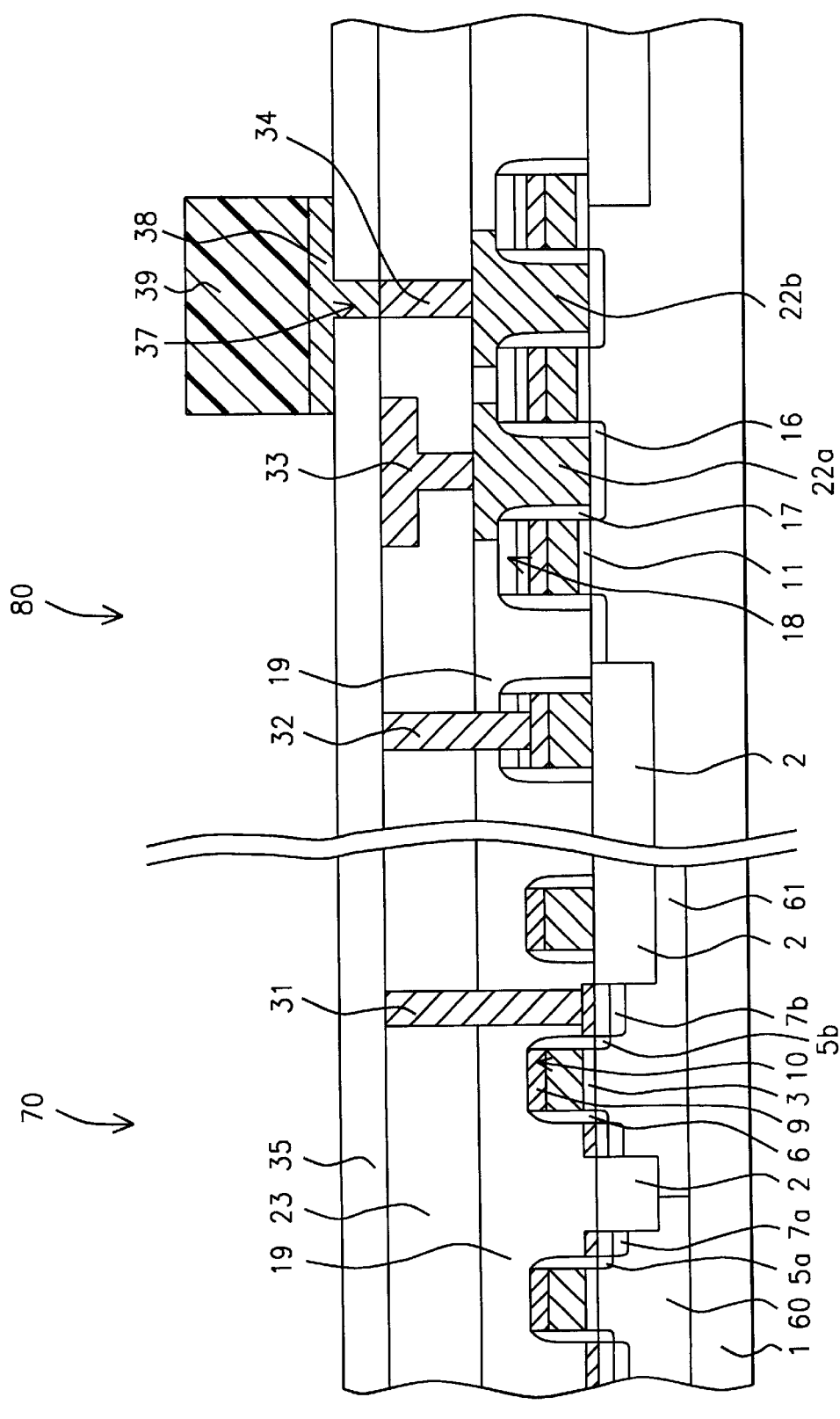

FIG. 12, schematically shows insulator layer 35, comprised of either silicon oxide, BPSG, or silicon nitride, obtained via PECVD or LPCVD procedures, to a thickness between about 1500 to 2500 Angstroms. Insulator layer 35, can also be a composite layer, comprised of a thin silicon nitride layer, on an underlying silicon oxide layer. The silicon nitride component of the composite insulator layer, will allow a subsequent, overlying layer of silicon oxide to be selectively removed using dilute HF, without attacking underlying insulator layers. Photoresist shape 36, is used as a mask to allow opening 37, with a diameter between about 0.25 to 0.35 uM, to be created in insulator layer 35, via anisotropic RIE procedure, using $CHF_3$ as an etchant, exposing the top surface of lower tungsten plug 34. After removal of photoresist shape 36, via plasma oxygen ashing and careful wet cleans, polysilicon layer 38, is deposited, using LPCVD procedures, to a thickness between about 1000 to 3000 Angstroms, completely filling opening 37. Polysilicon layer 38, can be doped in situ, during deposition via the addition of arsine, or phosphine, to a silane ambient, or polysilicon layer 38, can be deposited intrinsically, then doped via ion implantation procedures, using arsenic or phosphorous ions. Photoresist shape 39, is used as a mask to allow an anisotropic RIE procedure, using $Cl_2$ as an etchant, to pattern polysilicon layer 38, creating a bottom portion of a capacitor storage node structure. This is schematically shown in FIG. 13. Removal of photoresist shape 39, is accomplished using plasma oxygen ashing and careful wet cleans.

Figure 14:
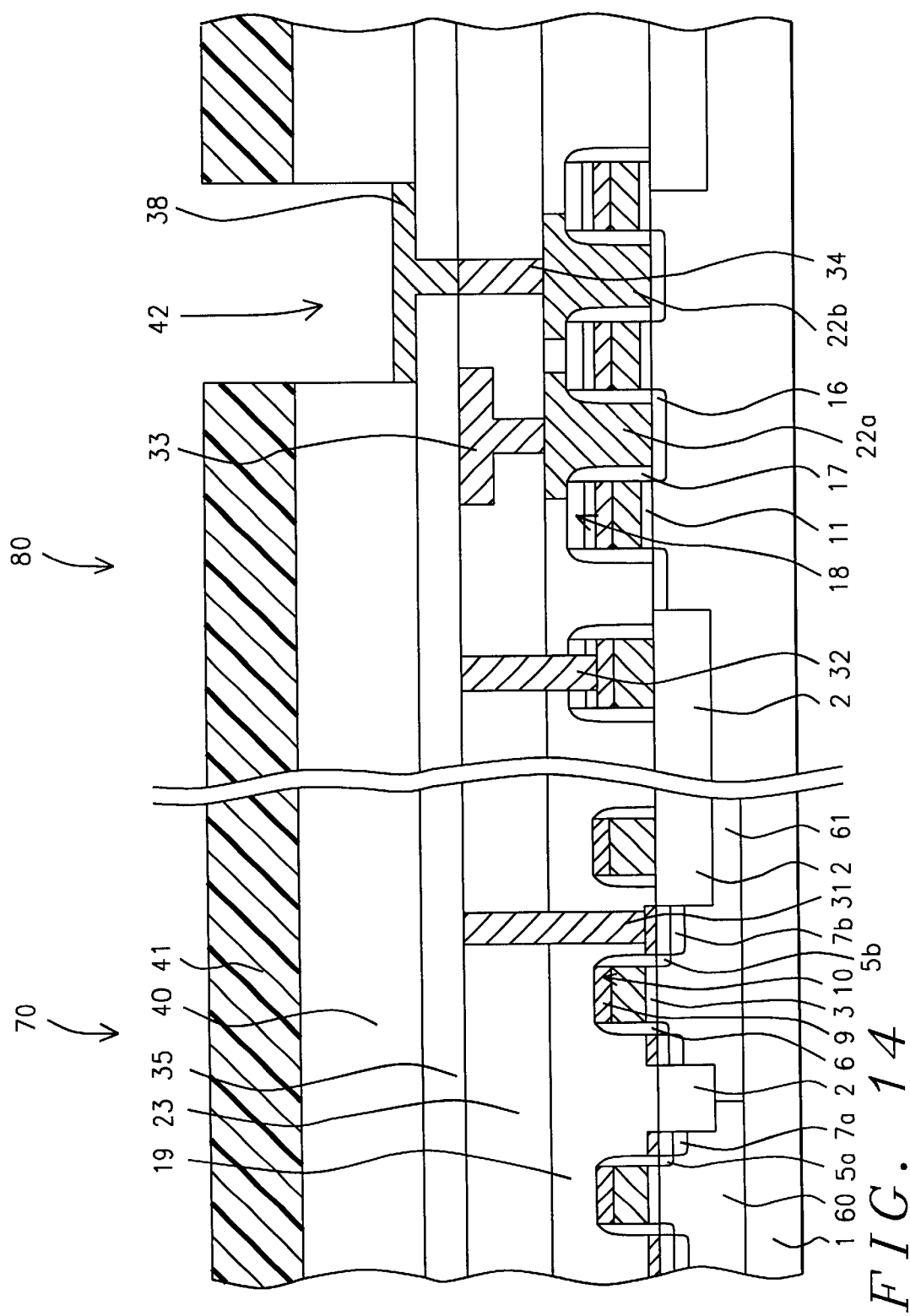
Figure 15:
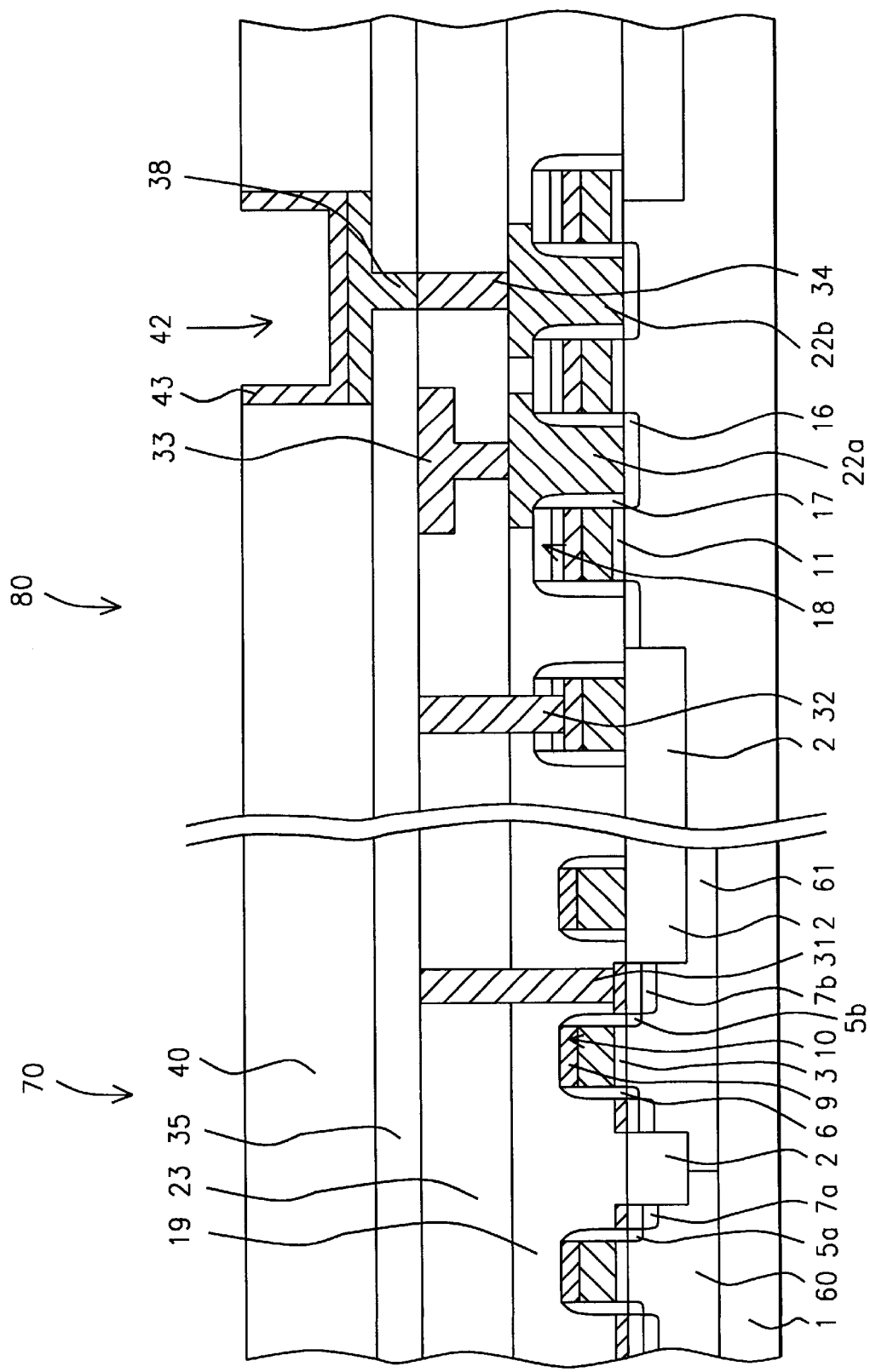
Figure 16:
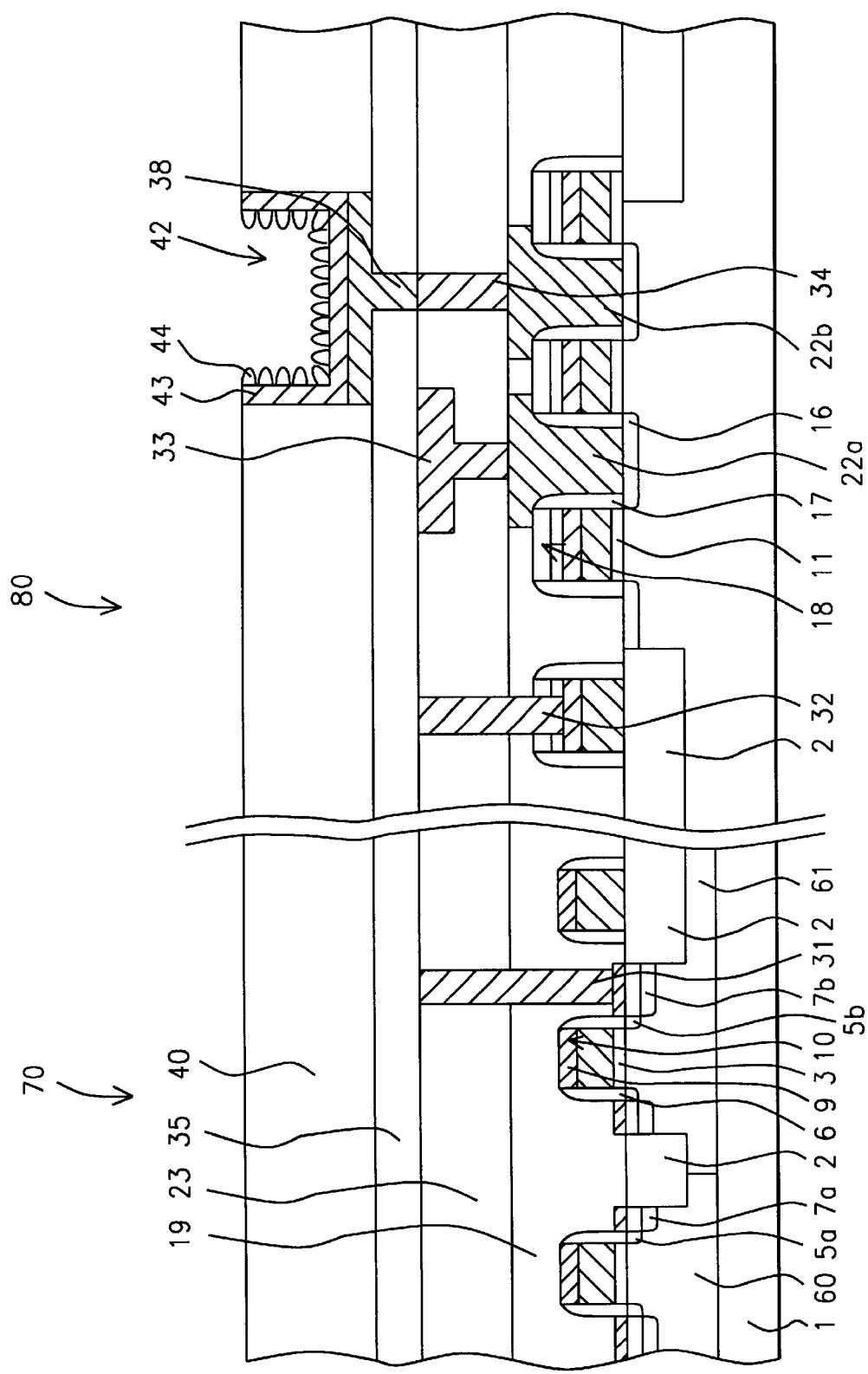

FIGS. 14–16, will schematically show the formation of a storage node structure, in DRAM array region 80. A silicon oxide layer 40, is deposited via LPCVD or PECVD procedures, to a thickness between about 4000 to 6000 Angstroms. Photoresist shape 41, is used as a mask allowing silicon oxide layer 40, to be removed from the top surface of polysilicon layer 38, via anisotropic RIE procedures, using $CHF_3$ as an etchant, creating opening 42, shown schematically in FIG. 14. Another option is to use a thin silicon nitride layer, on insulator layer 35. The procedure for opening 42, would selectively stop at the thin silicon nitride layer, with the removal of exposed regions of silicon oxide layer 40, accomplished using a wet HF solution. After removal of photoresist shape 41, again via plasma oxygen ashing and careful wet cleans, polysilicon layer 43, is deposited using LPCVD procedures, to a thickness between about 200 to 400 Angstroms. Polysilicon layer 43, is doped in situ, during deposition, via the addition of arsine, or phosphine, to a silane ambient. A CMP procedure is next employed, removing polysilicon layer 43, from the top surface of silicon oxide layer 40, creating the crown shaped structure, comprised of vertical polysilicon features, on the sides of opening 42, connected by the horizontal segment of polysilicon layer 43, overlying polysilicon layer 38. This is schematically shown in FIG. 15. Finally a hemispherical grain, (HSG), polysilicon layer 44, is selectively grown on the exposed surfaces of polysilicon layer 43. HSG polysilicon layer 43, schematically shown in FIG. 16, is deposited at a temperature between about 400 to 600° C., at a pressure between about 0.1 to 1.0 mTorr, and with a silane flow between about 20 to 60 sccm, and offers a roughened surface, comprised of convex and concave features, resulting in increased surface area, and thus increased capacitance and performance, when compared to counterpart storage node structures, fabricated with smooth polysilicon surfaces.

Figure 17:
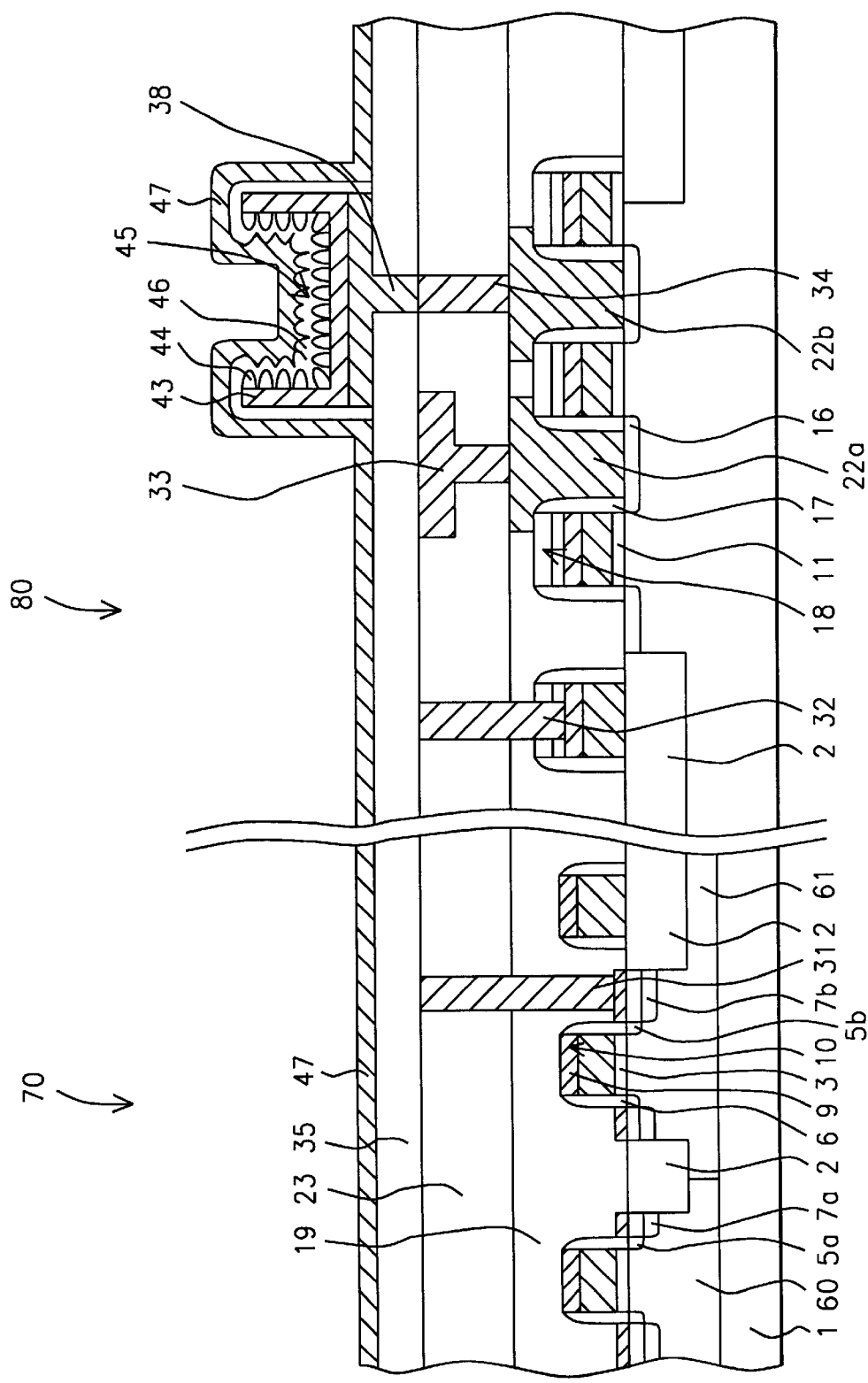

Masking silicon oxide layer 40, is next selectively removed from the top surface of insulator layer 35, using a dilute HF solution, creating crown shaped, storage node structure 45, comprised of HSG polysilicon layer 44, polysilicon layer 43, and polysilicon layer 38. A capacitor dielectric layer 46, comprised of an ONO layer, (Oxidized Nitride), at an equivalent silicon dioxide thickness between about 40 to 60 Angstroms, is formed on crown shaped, storage node structure 45. A polysilicon layer 47, is then deposited, via LPCVD procedures, to a thickness between about 500 to 1500 Angstroms. Polysilicon layer 47, is either doped in situ, during deposition, via the addition of arsine, or phosphine, to a silane ambient, or polysilicon layer 47, is deposited intrinsically and doped via ion implantation procedures, using arsenic or phosphorous ions. The result of these procedures is schematically shown in FIG. 17.

Figure 18:
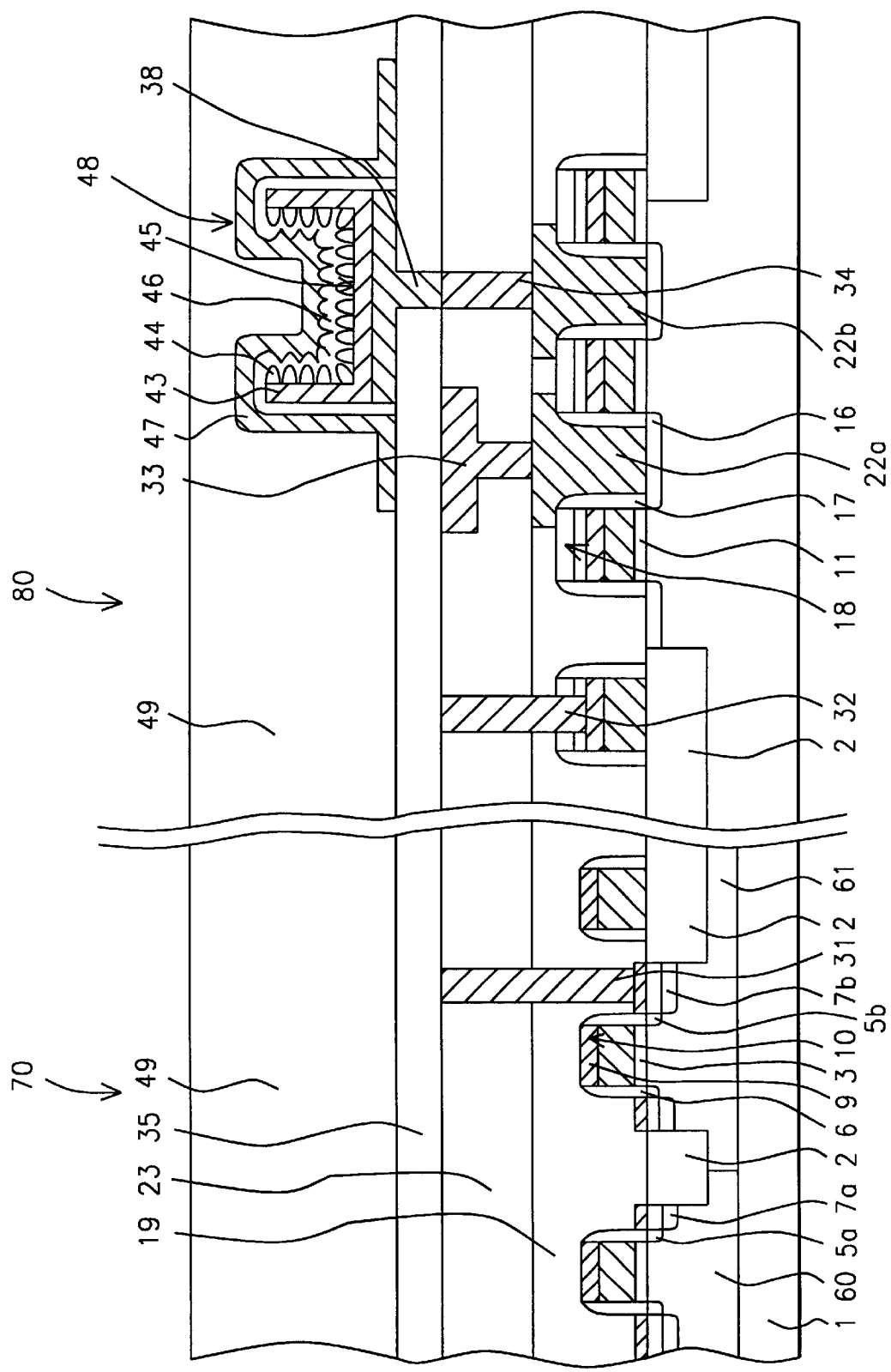
Figure 19:
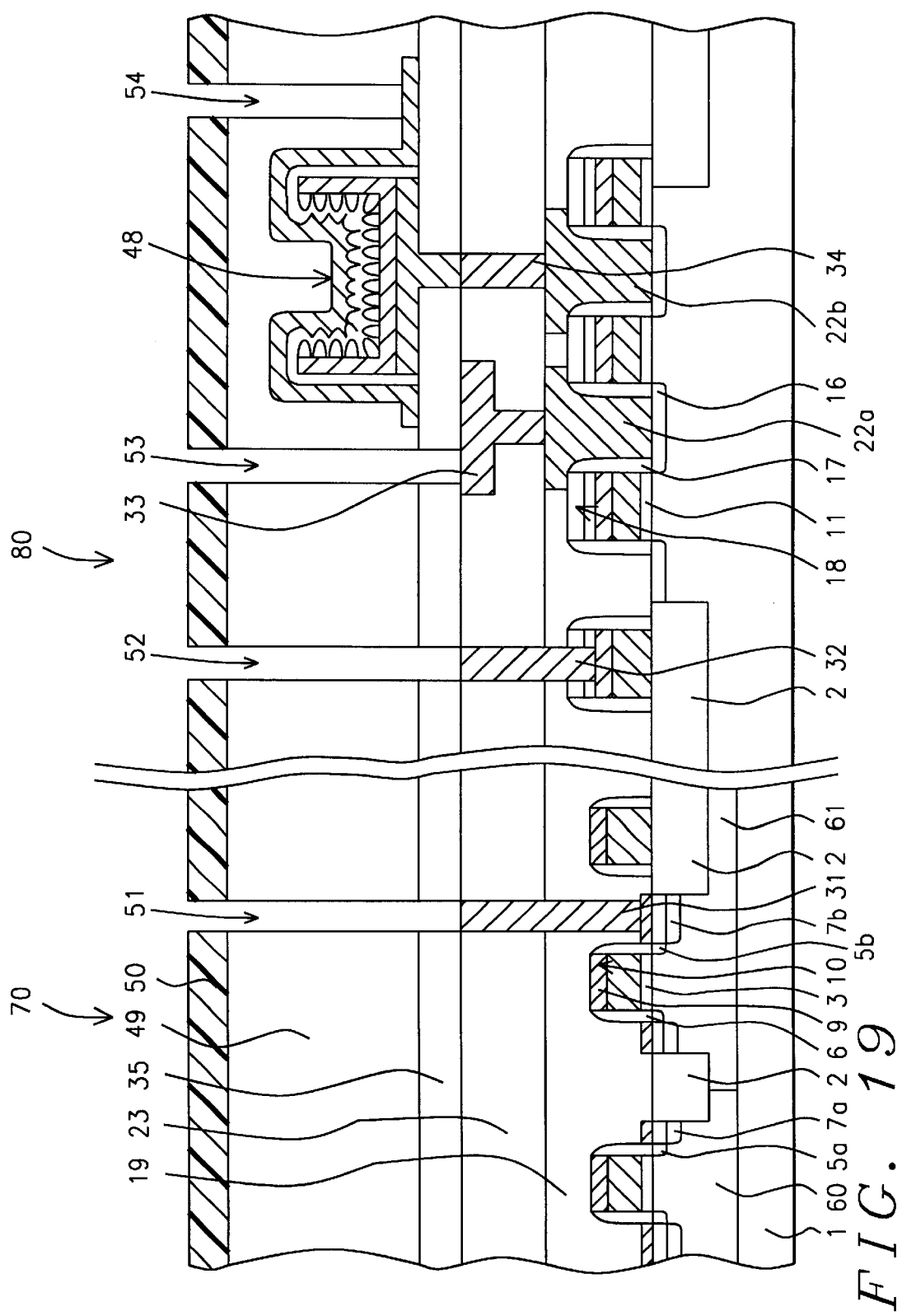

A photoresist shape, (not shown in drawings), is used as a mask to define the capacitor cell plate, via an anisotropic RIE procedure performed to polysilicon layer 47, using $Cl_2$ as an etchant. The resulting stacked capacitor structure 48, comprised of polysilicon cell plate 47, capacitor dielectric layer 46, and crown shaped storage node structure 45, featuring HSG polysilicon layer 44, is schematically shown in FIG. 18. Insulator layer 49, comprised of silicon oxide, or BPSG, is next deposited using LPCVD or PECVD procedures, to a thickness between about 8000 to 10000 Angstroms. A planarization procedure, performed using a CMP procedure, is employed to create a smooth top surface topography for insulator layer 49, schematically shown in FIG. 18. Photoresist shape 50, is then used as a mask to allow an anisotropic RIE procedure, using $CHF_3$ as an etchant: to create upper contact hole opening 51, with a diameter between about 0.25 to 0.35 uM, in insulator layer 49, and in insulator layer 35, exposing the top surface of lower tungsten plug 31; to create upper contact hole opening 52, with a diameter between about 0.25 to 0.35 uM, in insulator layer 49, and in insulator layer 35, exposing the top surface of lower tungsten plug 32; to create upper contact hole opening 53, with a diameter between about 0.25 to 0.35 uM, in insulator layer 49, and in insulator layer 35, exposing a portion of the top surface of bit line structure 33; and to create upper contact hole opening 51, with a diameter between about 0.25 to 0.35 uM, in insulator layer 49, exposing a portion of the top surface of stacked capacitor structure 48. The result of this procedure is schematically shown in FIG. 19.

Figure 20:
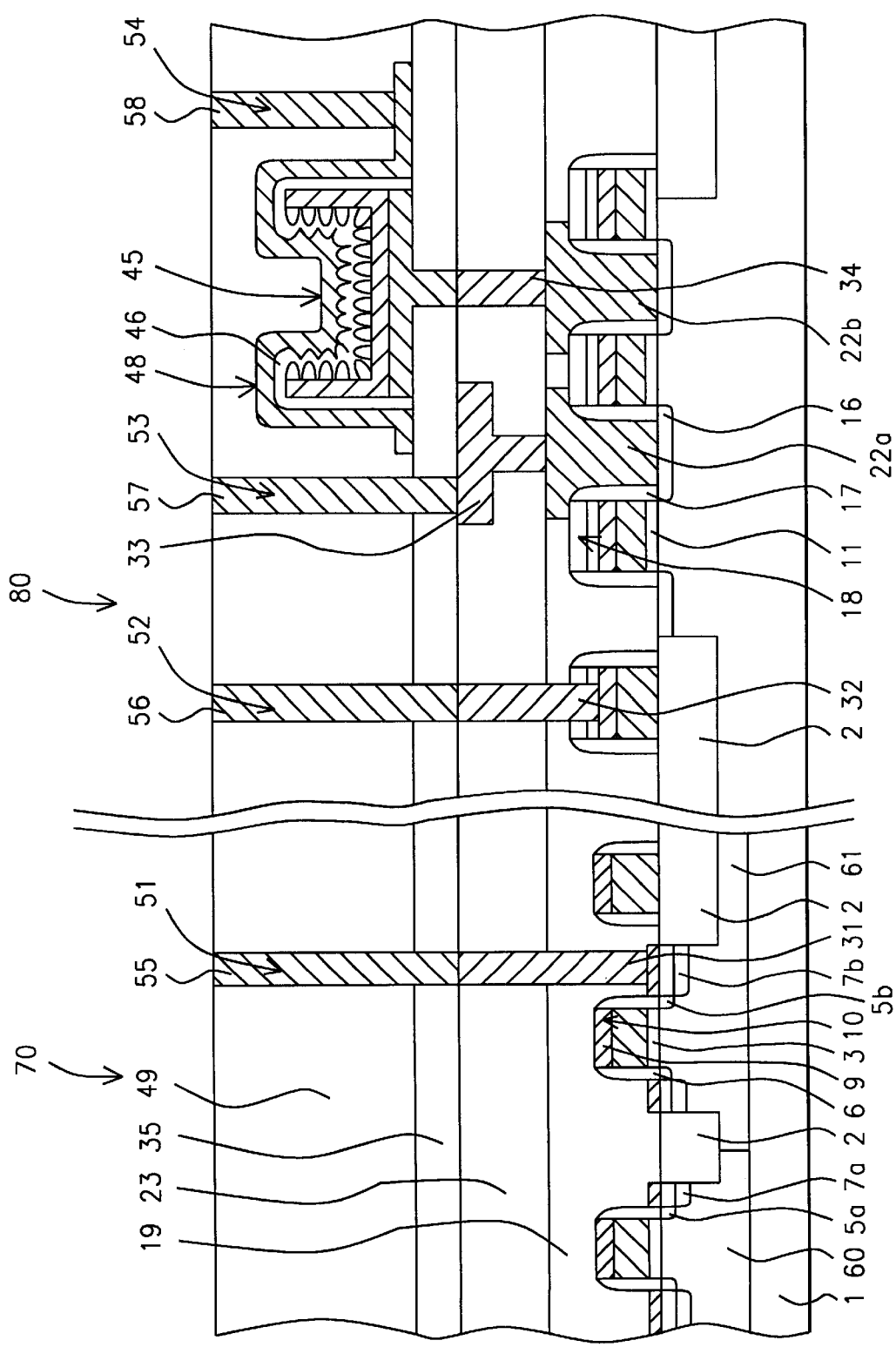

After removal of photoresist shape 50, again using plasma oxygen ashing and careful wet cleans, a tungsten layer is deposited, via LPCVD or R. F. sputtering procedures, to a thickness between about 4000 to 6000 Angstroms, completely filling upper contact hole openings 51, 52, 53, and 54. Unwanted regions of the tungsten layer, residing on the top surface of insulator layer 49, are removed using either a selective RIE procedure, using $Cl_2$ as an etchant, or using a CMP procedure. The result of these procedures is shown schematically in FIG. 20, comprised of: upper tungsten plug 55, directly overlying lower tungsten plug 51; upper tungsten plug 56, directly overlying lower tungsten plug 52; upper tungsten plug 57, overlying and contacting bit line structure 33, and upper tungsten plug 58, overlying and contacting stacked capacitor structure 48. The use of this invention, allowed the aspect ratio for the upper, and for the lower, narrow diameter contact hole, (for example upper contact hole opening 51, and lower contact hole opening 27), to be between about 3 or 4, to 1, based on a depth of about 10000 Angstroms, and a diameter of about 0.3 uM. If only one contact opening, with a diameter between about 0.25 to 0.35 uM, were used in insulator layers of about 20000 Angstroms, the aspect ratio would be between about 6 or 8, to 1, making it extremely difficult to define, via anisotropic RIE procedures, and even more difficult to fill with a metal.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating two step, narrow diameter contact holes, in thick insulator layers, for logic cells, and for DRAM array cells, on a semiconductor substrate, comprising the steps of:

providing polysilicon gate structures, with silicon nitride spacers on the sides of said polysilicon gate structures, on a first silicon dioxide gate insulator layer, with lightly doped source/drain regions, and with heavily doped source/drain regions, in regions of said logic cell, not covered by said polysilicon gate structures, and with a titanium silicide layer on the top surfaces of said polysilicon gate structures, and on the top surfaces of said heavily doped source/drain regions;

providing silicon nitride capped, polycide gate structures, with silicon nitride spacers on the sides of said silicon nitride capped, polycide gate structures, on a second silicon dioxide gate insulator layer, with lightly doped source/drain regions, in regions of said DRAM array, not covered by said silicon nitride capped, polycide gate structures;

depositing a first insulator layer;

planarizing said first insulator layer;

creating a first SAC opening, in said first insulator layer, between a first silicon nitride capped, polycide gate structure, and a second silicon nitride capped, polycide gate structure, and creating a second SAC opening, in said first insulator layer, between said second silicon nitride capped, polycide gate structure, and a third silicon nitride capped, polycide gate structure;

depositing a first polysilicon layer, completely filling said first SAC opening, and said second SAC opening;

patterning of said first polysilicon layer, forming a first polysilicon plug, in said first SAC opening, and forming a second polysilicon plug, in said second SAC opening;

depositing a second insulator layer;

forming a first lower contact hole opening, in said second insulator layer, and in said first insulator layer, exposing a heavily doped source/drain region, in said logic cell region;

forming a second lower contact hole opening, in said second insulator layer, in a top portion of said first insulator layer, and in a silicon nitride layer, of a fourth silicon nitride capped, polycide gate structure, exposing a tungsten silicide layer, of said fourth silicon nitride capped, polycide gate structure;

forming a third lower contact hole opening, in said second insulator layer, and in said first insulator layer, exposing a portion of the top surface of said second polysilicon plug;

forming a dual shaped opening in said second insulator layer, comprised of a wide diameter opening, in a top portion of said second insulator layer, and comprised of a narrow diameter opening, in a bottom portion of said second insulator layer, exposing a portion of the top surface of said first polysilicon plug;

depositing a first tungsten layer;

patterning of said first tungsten layer to form: a first lower tungsten plug, in said first lower contact hole opening; a second lower tungsten plug, in said second lower contact hole opening; a third lower tungsten plug, in said third lower contact hole opening; and a tungsten bit line structure, in said dual shaped opening;

depositing a third insulator layer;

forming a storage node opening in said third insulator layer, exposing said third lower tungsten plug;

depositing a second polysilicon layer, completely filling said storage node opening;

patterning of said second polysilicon layer, forming the bottom portion of a storage node structure;

forming the upper portion of said storage node structure, from a third polysilicon layer, with said upper portion of said storage node structure, comprised of vertical and horizontal features of said third polysilicon layer, and overlying said bottom portion of said storage node structure;

forming a HSG polysilicon layer, on said upper portion of said storage node structure;

forming a capacitor dielectric layer on said storage node structure;

forming a polysilicon cell plate, from a fourth polysilicon layer, overlying said storage node structure, resulting in a crown shaped, stacked capacitor structure, comprised of said polysilicon cell plate, said capacitor dielectric layer, and said storage node structure;

depositing a fourth insulator layer;

planarizing said fourth insulator layer;

forming a first upper contact hole opening, in said fourth insulator layer, and in said third insulator layer, exposing the top surface of said first lower tungsten plug;

forming a second upper contact hole opening in said fourth insulator layer, and in said third insulator layer, exposing the top surface of said second lower tungsten plug;

forming a third upper contact hole opening, in said fourth insulator layer, exposing a portion of said polysilicon cell plate;

forming a fourth upper contact hole opening in said fourth insulator layer, and in said third insulator layer, exposing a portion of the top surface of said tungsten bit line structure;

depositing a second tungsten layer; and patterning of said second tungsten layer to form: a first upper tungsten plug, in said first upper contact hole opening; a second tungsten plug, in said second upper contact hole opening; a third upper tungsten plug, in said third upper contact hole opening; and a fourth tungsten plug, in said fourth upper contact hole opening.

2. The method of claim 1, wherein said first silicon dioxide gate insulator layer is thermally grown in an oxygen—steam ambient, to a thickness between about 40 to 60 Angstroms.

3. The method of claim 1, wherein said second silicon dioxide gate insulator layer is thermally grown in an oxygen—steam ambient, to a thickness between about 70 to 80 Angstroms.

4. The method of claim 1, wherein said first lower contact hole opening, with a diameter between about 0.25 to 0.35 uM, is formed in said second insulator layer, and in said first insulator layer, to a depth between about 8000 to 12000 Angstroms, via an anisotropic RIE procedure, using $CHF_3$ as an etchant.

5. The method of claim 1, wherein said dual shaped opening is formed in said second insulator layer, via an anisotropic RIE procedure, using $CHF_3$ as an etchant, with said dual shaped opening comprised of a wide opening in a top portion of said second insulator layer, with a diameter between about 0.30 to 0.40 uM, and to a depth between about 1500 to 2500 Angstroms, and comprised of a narrow opening in a bottom portion of said second insulator layer, with a diameter between about 0.25 to 0.35 uM, and to a depth between about 1500 to 2500 Angstroms.

6. The method of claim 1, wherein said first upper tungsten plug is formed from said first tungsten layer, obtained via LPCVD or R.F. sputtering, at a thickness between about 3000 to 5000 Angstroms.

7. The method of claim 1, wherein said tungsten bit line structure, in said dual shaped opening, is formed from said first tungsten layer, obtained via LPCVD or R.F. sputtering, to a thickness between about 3000 to 6000 Angstroms.

8. The method of claim 1, wherein said third insulator layer is silicon dioxide, obtained via LPCVD or PECVD procedures, at a thickness between about 1500 to 2500 Angstroms.

9. The method of claim 1, wherein said third insulator layer is a composite layer, at a thickness between about 1500 to 2500 Angstroms, comprised of an overlying silicon nitride layer, and an underlying silicon oxide layer, both obtained using LPCVD or PECVD procedures.

10. The method of claim 1, wherein said first upper contact hole opening, with a diameter between about 0.25 to 0.35 uM, is formed in said fourth insulator layer, and in said third insulator layer, to a depth between about 8000 to 12000 Angstroms, via an anisotropic RIE procedure, using $CHF_3$ as an etchant.

11. The method of claim 1, wherein said first upper tungsten plug, is formed from said second tungsten layer, obtained via LPCVD or R.F. sputtering procedures, at a thickness between about 4000 to 6000 Angstroms.

* * * * *